(12) United States Patent
Bin et al.

(10) Patent No.: US 11,393,839 B2
(45) Date of Patent: Jul. 19, 2022

(54) SEMICONDUCTOR DEVICE AND METHOD FOR FABRICATING THE SEMICONDUCTOR DEVICE

(71) Applicant: SK hynix Inc., Icheon-si (KR)

(72) Inventors: Jin-Ho Bin, Hanam-si (KR); Il-Young Kwon, Seoul (KR); Hye-Hyeon Byeon, Icheon-si (KR); Dong-Chul Yoo, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 16/865,954

(22) Filed: May 4, 2020

(65) Prior Publication Data

US 2021/0098485 A1 Apr. 1, 2021

(30) Foreign Application Priority Data

Sep. 30, 2019 (KR) .................. 10-2019-0120775

(51) Int. Cl.
*H01L 27/1157* (2017.01)
*H01L 29/66* (2006.01)
*H01L 27/11582* (2017.01)
*H01L 27/11578* (2017.01)
*H01L 27/11565* (2017.01)

(52) U.S. Cl.
CPC .... *H01L 27/11578* (2013.01); *H01L 27/1157* (2013.01); *H01L 27/11565* (2013.01)

(58) Field of Classification Search
CPC ......... H01L 27/11578; H01L 27/11565; H01L 27/1157; H01L 29/40117; H01L 27/11582; H01L 27/11568; H01L 27/11521; H01L 27/11556; H01L 29/4234; H01L 29/4991; H01L 29/66348; H01L 29/66833; H01L 29/792
See application file for complete search history.

(56) References Cited

U.S. PATENT DOCUMENTS

| | | | |
|---|---|---|---|
| 8,324,675 B2 * | 12/2012 | Moon | H01L 29/7926 438/257 |
| 9,305,932 B2 * | 4/2016 | Kanakamedala | H01L 21/32133 |
| 9,356,031 B2 | 5/2016 | Lee et al. | |
| 9,449,981 B2 | 9/2016 | Pachamuthu et al. | |

(Continued)

*Primary Examiner* — Shahed Ahmed
*Assistant Examiner* — Khatib A Rahman
(74) *Attorney, Agent, or Firm* — William Park & Associates Ltd.

(57) ABSTRACT

Disclosed is a semiconductor device with improved electrical characteristics and a method for fabricating the same, and the method may include forming an alternating stack in which dielectric layers and sacrificial layers are alternately stacked on a substrate, forming a first through portion in the alternating stack, etching first portions of the sacrificial layers through the first through portion, to form lateral recesses between the dielectric layers, forming charge trapping layers isolated in the lateral recesses, forming a second through portion by etching the alternating stack in which second portions of the sacrificial layers remain, removing the second portions of the sacrificial layers through the second through portion, to form gate recesses that expose non-flat surfaces of the charge trapping layers, flattening the non-flat surfaces of the charge trapping layers, and forming a gate electrode that fills the gate recesses.

18 Claims, 15 Drawing Sheets

(56) References Cited

U.S. PATENT DOCUMENTS

| | | | |
|---|---|---|---|
| 9,768,270 B2* | 9/2017 | Gunji-Yoneoka | ............................ H01L 29/40114 |
| 9,978,768 B2* | 5/2018 | Xu | ....................... H01L 29/7926 |
| 9,984,963 B2* | 5/2018 | Peri | ...................... H01L 29/4966 |
| 10,115,732 B2 | 10/2018 | Yu et al. | |
| 10,672,788 B2* | 6/2020 | Maeda | ................ G11C 16/0483 |
| 10,700,078 B1* | 6/2020 | Cui | .................... H01L 27/11524 |
| 2012/0001250 A1* | 1/2012 | Alsmeier | ........... H01L 27/11551 257/E21.409 |
| 2013/0171788 A1* | 7/2013 | Yang | ................. H01L 27/11582 438/268 |
| 2014/0225181 A1* | 8/2014 | Makala | ............. H01L 29/40114 438/264 |
| 2016/0035740 A1* | 2/2016 | Sawa | ................ H01L 21/02321 257/314 |
| 2017/0098659 A1* | 4/2017 | Yoshimizu | ........ H01L 21/02164 |
| 2018/0006041 A1* | 1/2018 | Xu | ....................... H01L 29/7926 |
| 2020/0194447 A1* | 6/2020 | Sun | .................... H01L 27/11529 |
| 2020/0227432 A1* | 7/2020 | Lai | ....................... H01L 23/5226 |
| 2021/0098479 A1* | 4/2021 | Son | ................... H01L 27/11582 |

* cited by examiner

SEMICONDUCTOR DEVICE AND METHOD FOR FABRICATING THE SEMICONDUCTOR DEVICE

CROSS-REFERENCE TO RELATED APPLICATIONS

The present application claims priority to Korean Patent Application No. 10-2019-0120775, filed on Sep. 30, 2019, which is incorporated herein by reference in its entirety.

BACKGROUND

1. Technical Field

Various embodiments relate generally to a semiconductor device, and more particularly, to a semiconductor device having a charge trapping material and a method for fabricating the same.

2. Related Art

For high integration of semiconductor devices, vertical semiconductor devices having memory cells arranged vertically in three dimensions have been proposed.

SUMMARY

In accordance with an embodiment, a method for fabricating a semiconductor device may include: forming a stacked body including a first layer, a second layer and a sacrificial layer provided between the first layer and the second layer; etching a first portion of the sacrificial layer to form a first gap between the first layer and the second layer; forming a third layer having a non-flat surface in the first gap; removing a second portion of the sacrificial layer to form a second gap that exposes the non-flat surface of the third layer between the first layer and the second layer; and flattening the non-flat surface of the third layer.

In accordance with an embodiment, a method for fabricating a semiconductor device may include: forming an alternating stack in which dielectric layers and sacrificial layers are alternately stacked on a substrate; forming a first through portion in the alternating stack; etching first portions of the sacrificial layers through the first through portion, to form lateral recesses between the dielectric layers; forming charge trapping layers isolated in the lateral recesses; forming a second through portion by etching the alternating stack in which second portions of the sacrificial layers remain; removing the second portions of the sacrificial layers through the second through portion, to form gate recesses that expose non-flat surfaces of the charge trapping layers; flattening the non-flat surfaces of the charge trapping layers; and forming a gate electrode that fills the gate recesses.

In accordance with an embodiment, a method for fabricating a semiconductor device may include: forming a stacked body including a first layer, a second layer and a sacrificial layer provided between the first layer and the second layer; etching a first portion of the sacrificial layer to form a first gap between the first layer and the second layer; forming a third layer having an inner sidewall which includes a non-flat surface in the first gap; removing a second portion of the sacrificial layer to form a second gap that exposes the inner sidewall having the non-flat surface of the third layer between the first layer and the second layer; and flattening the non-flat surface of the third layer.

DETAILED DESCRIPTION

Figure 1A:
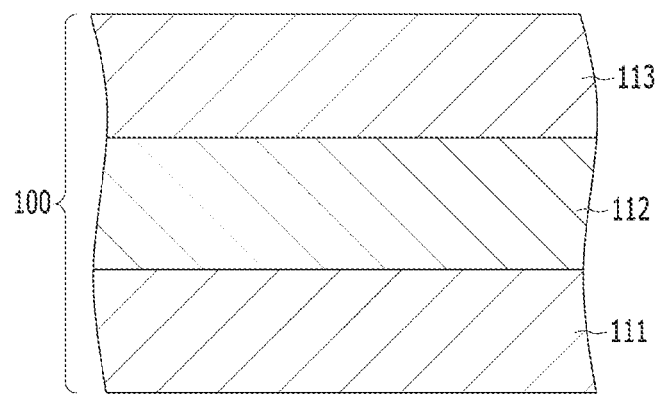
FIGS. 1A, 1B, 1C, 1D, 1E, 1F, 1G, 1H, 1I, 1J, and 1K are cross-sectional views illustrating a method for fabricating a semiconductor device in accordance with an embodiment.

Various embodiments described herein may be described with reference to cross-sectional views, plan views and block diagrams, which are schematic views of the semiconductor device according to embodiments of the present disclosure. It is noted that the structures of the drawings may be modified by fabricating techniques and/or tolerances. The embodiments not limited to the described embodiments and the structures shown in the drawings, but may include other embodiments, or modifications of the described embodiments including any changes in the structures that may be produced according to requirements of the fabricating process. Accordingly, the regions illustrated in the drawings have schematic attributes, and the shapes of the regions illustrated in the drawings are intended to illustrate structures of regions of the elements, and are not intended to limit the scope of the disclosure.

Embodiments described below may be directed to a method for converting a curvature shape of an isolated charge trapping material (CTL) into a flat shape.

Various embodiments may be directed to a semiconductor device with improved electrical characteristics, and a method for fabricating the same.

FIGS. 1A to 1K are cross-sectional views illustrating a method for fabricating a semiconductor device in accordance with an embodiment.

As illustrated in FIG. 1A, a stacked body 100 may be prepared. The stacked body 100 may include a first layer 111, a second layer 113 and a first sacrificial layer 112 between the first layer 111 and the second layer 113.

For example, the first layer 111 may be formed on a substrate (not illustrated) or other layers. The first sacrificial layer 112 may be formed on the first layer 111, and the second layer 113 may be formed on the first sacrificial layer 112. The first sacrificial layer 112 may be located between the first layer 111 and the second layer 113.

The first sacrificial layer 112 may be a layer having a different material from the first and second layers 111 and 113, and an etch selectivity of the first sacrificial layer 112 with respect to the first and second layers 111 and 113 may be sufficiently high. The first and second layers 111 and 113 may be the same material or different materials.

Each of the first and second layers 111 and 113 may include silicon oxide, and the first sacrificial layer 112 may include silicon nitride, a metal material or polysilicon. Each of the first and second layers 111 and 113 may include silicon nitride, and the first sacrificial layer 112 may include silicon oxide.

Figure 1B:
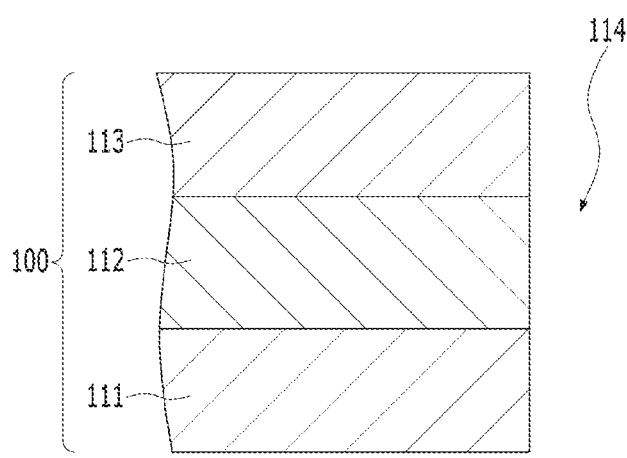

As illustrated in FIG. 1B, a first through portion 114 may be formed in the stacked body 100. The first through portion 114 may be, for example, a hole or slit formed by an anisotropic etch process, such as reactive ion etching (RIE) process. The first through portion 114 may be referred to as an "opening".

The first through portion 114 may penetrate the second layer 113, the first sacrificial layer 112 and the first layer 111, and be extended along a stacking direction of the first layer 111, the first sacrificial layer 112 and the second layer 113. The sidewall of the first through portion 114 may be provided by the surface of the first layer 111, the surface of the first sacrificial layer 112 and the surface of the second layer 113.

Figure 1C:
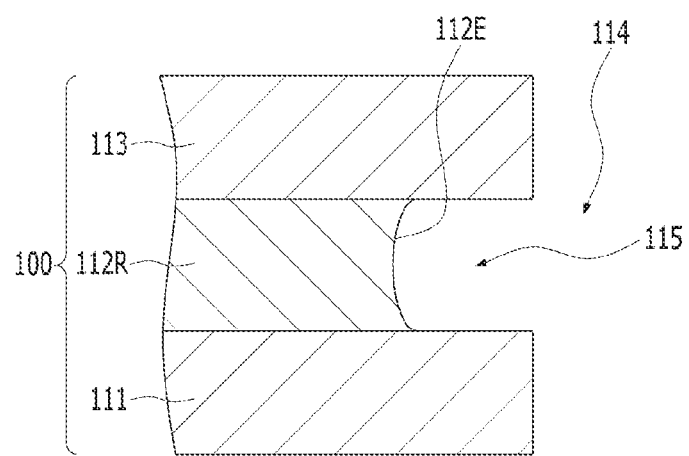

As illustrated in FIG. 1C, when an etchant or an etching gas is supplied to the first through portion 114, a part of the first sacrificial layer 112 (hereinafter, abbreviated as a first part) may be selectively etched. For example, when the first sacrificial layer 112 is silicon oxide, the silicon oxide may be etched by supplying an etchant including hydrofluoric acid to the first through portion 114. The first and second layers 111 and 113 may be, for example, silicon nitride or a metal material, and the metal material and the silicon nitride have etching resistance to the etchant including hydrofluoric acid.

In some embodiments, when the first sacrificial layer 112 is silicon nitride, the silicon nitride may be etched by supplying an etchant including phosphoric acid to the first through portion 114. The first and second layers 111 and 113 may be, for example, silicon oxide, and the silicon oxide has etching resistance to the etchant including phosphoric acid.

The first part of the first sacrificial layer 112 may be etched, starting from an end surface 112E of the first sacrificial layer 112 exposed in the first through portion 114. The end surface 112E of the first sacrificial layer 112 may be recessed in a diametral direction or a width direction of the first through portion 114. Accordingly, the end surface 112E of the first sacrificial layer 112 may be separated from the first through portion 114. The recessed end surface 112E of the first sacrificial layer 112 may have a rounded sidewall, for example, a concave-shape sidewall.

By etching the first part of the first sacrificial layer 112, a first gap 115, for example, an air gap, continuous from the first through portion 114 may be formed between the first layer 111 and the second layer 113. A part of the first sacrificial layer 112 (hereinafter, abbreviated as a second part) may remain between the first layer 111 and the second layer 113. Hereinafter, the remaining second part of the first sacrificial layer 112 is indicated by reference numeral "112R". The first gap 115 may be formed between the first through portion 114 and the first sacrificial layer 112R. In an embodiment, a gap 115 may include air. In other embodiments the gap 115 may include a gas.

Figure 1D:
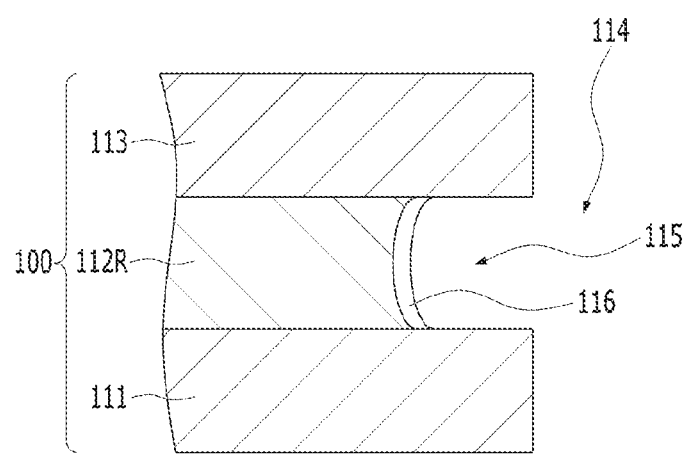

As illustrated in FIG. 1D, a second sacrificial layer 116 may be formed on the end surface of the first sacrificial layer 112R. The second sacrificial layer 116 may be formed on the sidewall surface of the first sacrificial layer 112R. The second sacrificial layer 116 and the first sacrificial layer 112R may be different materials. In order to form the second sacrificial layer 116, a selective oxidation process may be performed. The selective oxidation process may selectively oxidize the sidewall surface of the first sacrificial layer 112R. The selective oxidation process may include a thermal oxidation process, a radical oxidation process or a plasma oxidation process. When the first sacrificial layer 112R includes silicon nitride, the second sacrificial layer 116 may be silicon oxynitride or silicon oxide. The second sacrificial layer 116 may have an extremely small thickness that does not fill the first gap 115. The second sacrificial layer 116 may cover the sidewall surface of the first sacrificial layer 112R. Although not illustrated, the surfaces of the first and second layers 111 and 113 exposed in the first gap 115 may be locally oxidized during the selective oxidation process.

The second sacrificial layer 116 may be formed of a discrete material located at the level of the first sacrificial layer 112R. The second sacrificial layer 116 may be located between the first layer 111 and the second layer 113.

In some embodiments, deposition and etch-back processes may be performed on a continuous sacrificial blocking layer (not illustrated) to form the second sacrificial layer 116. In this case, a conformal deposition process may be performed to deposit the continuous sacrificial blocking layer. The continuous sacrificial blocking layer may include silicon oxide or silicon oxynitride. An additional etch-back process may be performed on the continuous sacrificial blocking layer so that the discrete second sacrificial layer 116 remains at the level of the first sacrificial layer 112R.

The second sacrificial layer 116 may be formed along the profile of the end surface of the first sacrificial layer 112R. Accordingly, the surface of the second sacrificial layer 116 may have a rounded profile, and the rounded surface of the second sacrificial layer 116 may contact the end surface of the first sacrificial layer 112R.

When a third layer 117, which is to be formed, is a different material from the first sacrificial layer 112, the second sacrificial layer 116 may be omitted. For example, when the first sacrificial layer 112 is silicon nitride and the third layer 117 is silicon oxide, the second sacrificial layer 116 may be omitted. When the first sacrificial layer 112 and the third layer 117 are silicon nitride, it is difficult to control an etching end point during a dip-out process for the first sacrificial layer 112R, which will be described later.

Figure 1E:
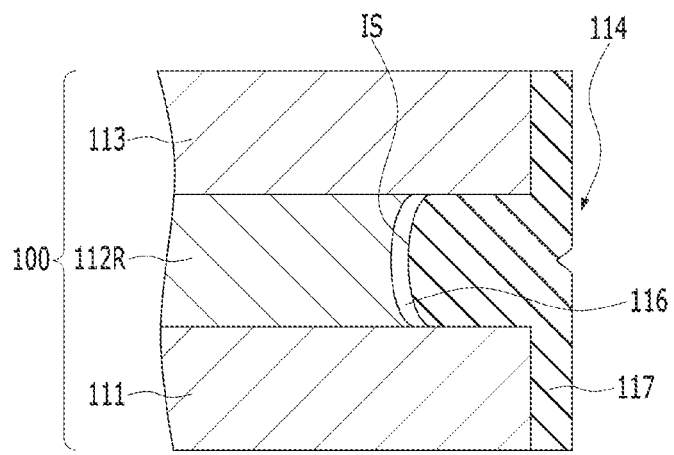

As illustrated in FIG. 1E, the third layer 117 may be formed in the first gap 115. The third layer 117 may cover the surfaces of the first and second layers 111 and 113. The third layer 117 may cover the second sacrificial layer 116. The third layer 117 may fill the first gap 115 without voids. The third layer 117 may include a charge trapping material. The third layer 117 may include a charge trapping dielectric material such as silicon nitride. The third layer 117 may be formed by a conformal deposition process such as chemical vapor deposition (CVD) or atomic layer deposition (ALD). The third layer 117 may be a continuous charge trapping material. The third layer 117 may fully fill the first gap 115, and partially fill a central portion of the first through portion 114. In the first gap 115, a sidewall, that is, an inner sidewall IS, of the third layer 117 may contact the sidewall of the second sacrificial layer 116. The inner sidewall IS of the third layer 117 may be convex in a direction facing the first sacrificial layer 112R. The inner sidewall IS of the third layer 117 may have a rounded profile, and the rounded sidewall of the third layer 117 may contact the second sacrificial layer 116.

Figure 1F:
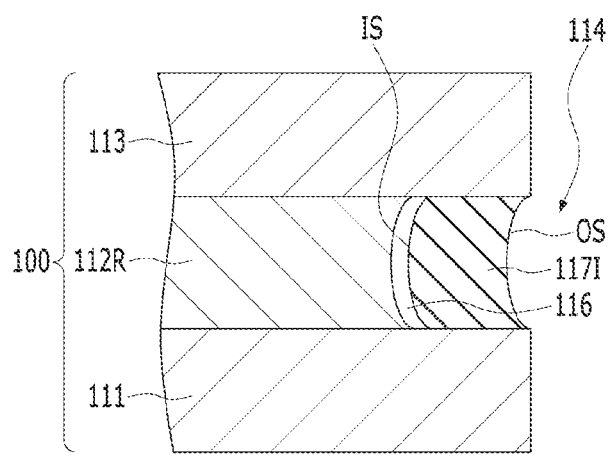

As illustrated in FIG. 1F, a trimming process may be performed on the third layer 117. The trimming process for the third layer 117 may include a selective etch process. The trimming process for the third layer 117 may include an isotropic etch process or an anisotropic etch process. For example, the trimming process for the third layer 117 may include a wet etch process. When the third layer 117 includes silicon nitride, the trimming process for the third layer 117 may be performed using phosphoric acid. In some embodiments, the trimming process for the third layer 117 may include an etch-back process.

An isolated third layer 117I may be formed by the trimming process for the third layer 117, and be formed in the first gap 115. The isolated third layer 117I may be located at the levels of the first and second sacrificial layers 112R and 116. The isolated third layer 117I may directly contact the second sacrificial layer 116. The sidewall of the isolated third layer 117I, which contacts the second sacrificial layer 116, that is, the inner sidewall IS of the isolated third layer 117I may have a rounded profile. The sidewall of the isolated third layer 117I, which does not contact the second sacrificial layer 116, that is, the outer sidewall OS of the isolated third layer 117I, may have a rounded profile or a vertical profile.

Figure 1G:
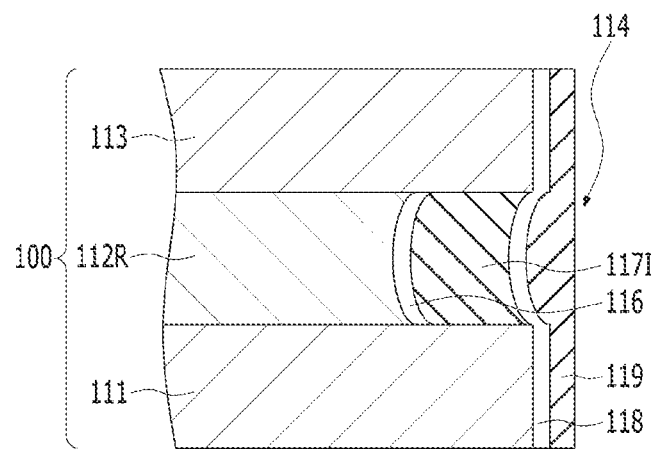

As illustrated in FIG. 1G, a fourth layer 118 may be formed on the isolated third layer 117I. The fourth layer 118 may be formed in the first through portion 114, and cover the sidewalls of the first and second layers 111 and 113 while covering the isolated third layer 117I. The fourth layer 118 may be conformally formed. The fourth layer 118 may include silicon oxide. The fourth layer 118 may serve as a tunnel dielectric layer.

A fifth layer 119 may be formed on the fourth layer 118. The fifth layer 119 may include a semiconductor material. For example, the fifth layer 119 may include any one of a polycrystalline semiconductor material, an amorphous semiconductor material and a monocrystalline semiconductor material. The fifth layer 119 may include silicon (Si), germanium (Ge), silicon germanium (SiGe), an III/V-group compound or an II/VI-group compound. The fifth layer 119 may include polysilicon. The fifth layer 119 may be conformally formed on the fourth layer 118 in the first through portion 114. The fifth layer 119 might not fill the first through portion 114. Although not illustrated, one or more other layers including a dielectric material may be further formed on the fifth layer 119, and the other layers may fill the first through portion 114. The fifth layer 119 may serve as a channel layer.

Figure 1H:
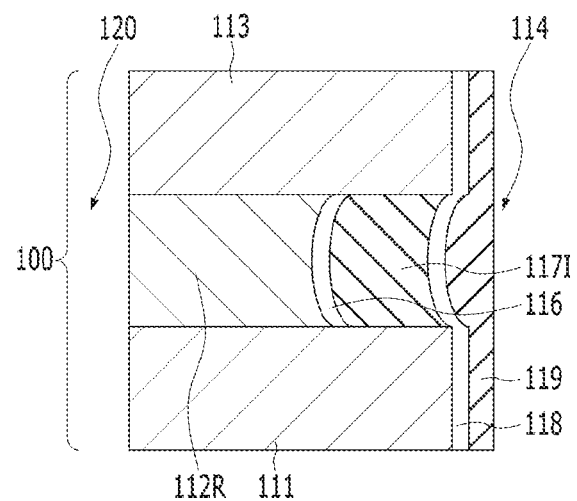

As illustrated in FIG. 1H, a second through portion 120 may be formed in a part region of the stacked body 100 in which the first sacrificial layer 112R remains. The second through portion 120 may be, for example, a hole or slit formed by an anisotropic etch process, such as a reactive ion etch (RIE) process. The second through portion 120 may be referred to as an opening. The first through portion 114 may have a hole shape, and the second through portion 120 may have a slit shape.

The second through portion 120 may penetrate the second layer 113, the first sacrificial layer 112R and the first layer 111, and be extended along the stacking direction of the first layer 111, the first sacrificial layer 112R and the second layer 113. The sidewall of the second through portion 120 may be provided by the surface of the first layer 111, the surface of the first sacrificial layer 112R and the surface of the second layer 113.

Figure 1I:
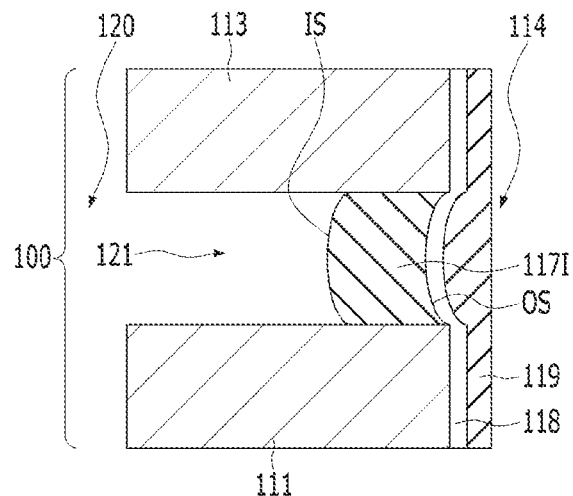

As illustrated in FIG. 1I, when an etchant or an etching gas is supplied to the second through portion 120, the first sacrificial layer 112R may be selectively etched. For example, when the first sacrificial layer 112R is silicon oxide, the silicon oxide may be etched by supplying an etchant including hydrofluoric acid to the second through portion 120. The first and second layers 111 and 113 may be, for example, silicon nitride or a metal material, and the metal material and the silicon nitride have etching resistance to the etchant including hydrofluoric acid.

In some embodiments, when the first sacrificial layer 112R is silicon nitride, the silicon nitride may be etched by supplying an etchant including phosphoric acid to the second through portion 120. The first and second layers 111 and 113 may be, for example, silicon oxide, and the silicon oxide has etching resistance to the etchant including phosphoric acid.

The first sacrificial layer 112R may be etched, starting from an end surface of the first sacrificial layer 112R exposed in the second through portion 120. The end surface of the first sacrificial layer 112R may be recessed in a diametral direction or a width direction of the second through portion 120.

By etching the first sacrificial layer 112R, a second gap 121, for example, an air gap, continuous from the second through portion 120 may be formed between the first layer 111 and the second layer 113. The first sacrificial layer 112R might not remain between the first layer 111 and the second layer 113. For example, all of the first sacrificial layer 112R may be removed, and thus the second sacrificial layer 116 may be exposed. The second gap 121 may be formed between the second through portion 120 and the second sacrificial layer 116. The second sacrificial layer 116 may control the etching end point of the first sacrificial layer 112R. The etch process for the first sacrificial layer 112R may include the dip-out process. In an embodiment, a gap 121 may include air. In other embodiments the gap 121 may include a gas.

Subsequently, the second sacrificial layer 116 may be removed. In order to remove the second sacrificial layer 116, a wet etch process may be performed. By removing the second sacrificial layer 116, the depth of the second gap 121 may be extended horizontally. After the second sacrificial layer 116 is removed, the inner sidewall IS of the isolated third layer 117I may be exposed in the second gap 121. The exposed inner sidewall IS of the isolated third layer 117I may be a non-flat surface, for example, a rounded profile. The inner edge profile of the second gap 121 may have a rounded profile. The rounded inner edge profile of the second gap 121 may be provided by the rounded inner sidewall IS of the isolated third layer 117I. The rounded inner sidewall IS of the isolated third layer 117I may have a positive profile. The positive rounded inner sidewall IS of the isolated third layer 117I may refer to a convex-shape sidewall.

The outer sidewall OS of the isolated third layer 117I might not be exposed by the second gap 121. The outer sidewall OS of the isolated third layer 117I may be covered by the fourth layer 118, and have a rounded negative profile. The positive rounded outer sidewall OS of the isolated third layer 117I may refer to a concave-shape sidewall.

Figure 1J:
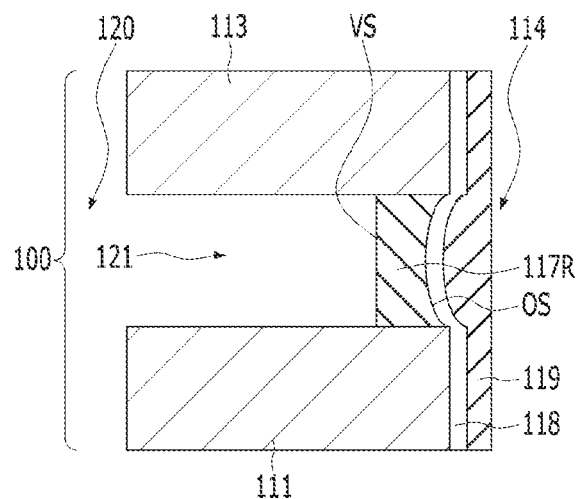

As illustrated in FIG. 1J, the rounded inner sidewall IS of the isolated third layer 117I may be modified. For example, the rounded inner sidewall IS of the isolated third layer 117I may be converted into a flat surface. The flat surface may refer to a flat sidewall. The flat surface may include a vertical sidewall or a sloped sidewall. The process of converting the rounded inner sidewall of the isolated third layer 117I into the flat sidewall may be referred to as a flattening process.

After the flattening process, the isolated third layer 117I may remain as reference numeral "117R". The isolated third layer 117R may include a vertical inner sidewall VS and a rounded outer sidewall OS. The top surface and the bottom surface of the vertical inner sidewall VS may directly contact the first layer 111 and the second layer 113, respectively. The rounded outer sidewall OS of the isolated third layer 117R may directly contact the fourth layer 118. The vertical inner sidewall VS may be a convex-shape sidewall, and the rounded outer sidewall OS may be a concave-shape sidewall.

In some embodiments, the top and bottom portions of the vertical inner sidewall VS may have sloped surfaces.

Accordingly, a gap may be formed between the vertical inner sidewall VS and the first and second layers 111 and 113.

Figure 1K:
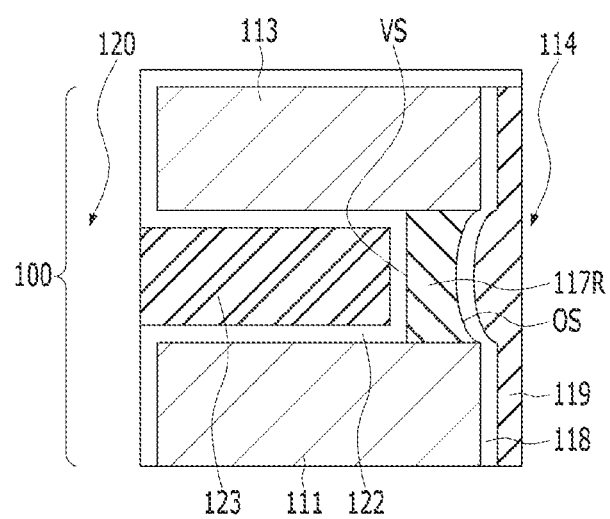

As illustrated in FIG. 1K, a sixth layer 122 may be formed on the vertical inner sidewall VS of the isolated third layer 117R. The sixth layer 122 may cover the exposed surfaces of the first and second layers 111 and 113 while covering the vertical inner sidewall VS of the isolated third layer 117R. The sixth layer 122 may be a continuous layer formed conformally. The sixth layer 122 may be deposited by a conformal deposition process. The sixth layer 122 may include oxide, metal oxide, a high-k material or combinations thereof. The sixth layer 122 may include silicon oxide, aluminum oxide, hafnium oxide or combinations thereof. The sixth layer 122 may serve as a blocking layer.

Subsequently, a seventh layer 123 may be formed on the sixth layer 122. The seventh layer 123 may include a conductive material. The seventh layer 123 may include polysilicon, a metal, metal nitride, metal silicide or combinations thereof. The seventh layer 123 may include titanium nitride, tungsten or a stack of titanium nitride and tungsten. The seventh layer 123 may be formed in the second gap 121. In order to form the seventh layer 123, a conductive material may be deposited to fill the second gap 121, and then an etch-back process may be performed on the conductive material. The seventh layer 123 may be located between the first layer 111 and the second layer 113. The seventh layer 123 may serve as a gate electrode.

FIGS. 2A to 2D are cross-sectional views illustrating modified examples of the flattening process.

Figure 2A:
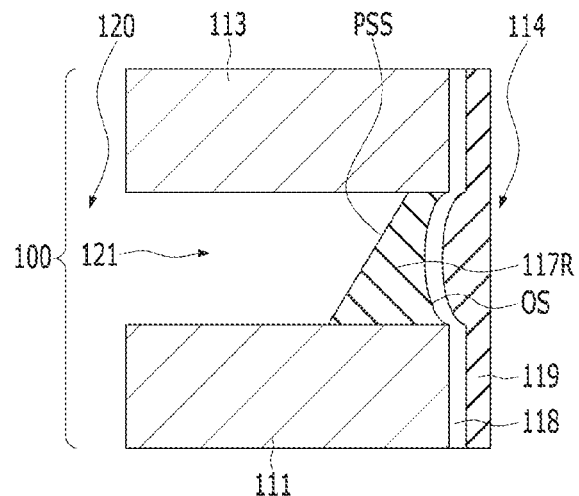
FIGS. 2A, 2B, 2C, and 2D are cross-sectional views illustrating modified examples of a flattening process.

Referring to FIG. 2A, after the flattening process, the isolated third layer 117R may include a positive sloped inner sidewall PSS and a rounded outer sidewall OS. For example, the positive sloped inner sidewall PSS may slope up and toward the rounded outer side wall as pictured in FIG. 2A.

Figure 2B:
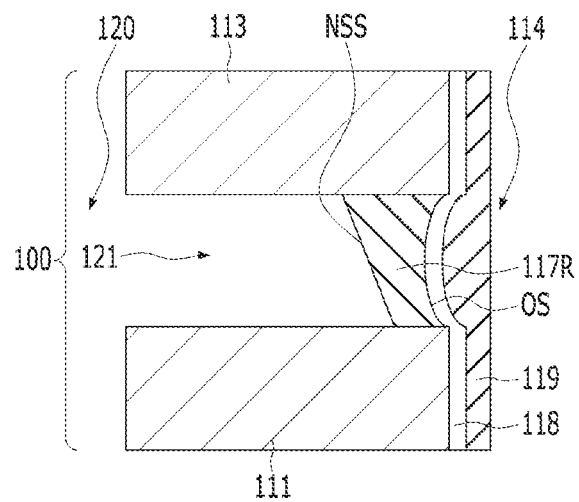

Referring to FIG. 2B, after the flattening process, the isolated third layer 117R may include a negative sloped inner sidewall NSS and a rounded outer sidewall OS. For example, the negative sloped inner sidewall NSS may slope up and away from the rounded outer side wall as pictured in FIG. 2B.

Figure 2C:
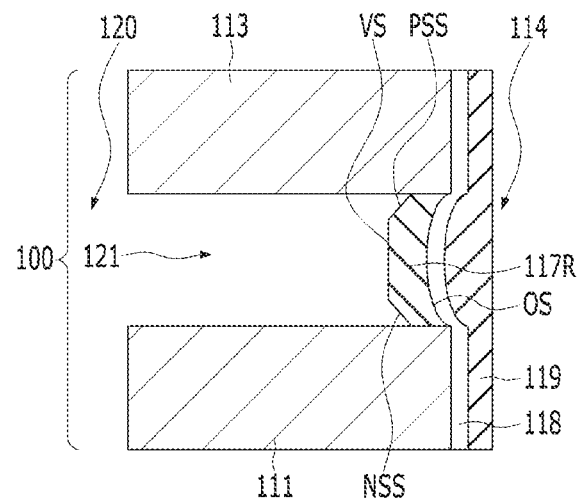

Referring to FIG. 2C, after the flattening process, the inner sidewall of the isolated third layer 117R may include a vertical sidewall VS, a negative sloped sidewall NSS and a positive sloped sidewall PSS. The central portion of the inner sidewall may be the vertical sidewall VS, the top portion of the inner sidewall may be the positive sloped sidewall PSS, and the bottom portion of the inner sidewall may be the negative sloped sidewall NSS.

Figure 2D:
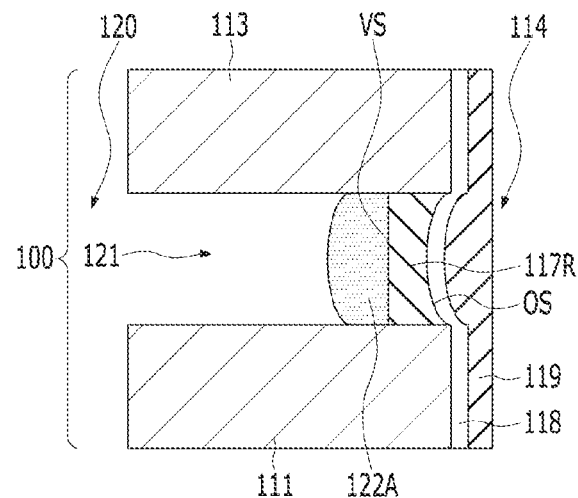

Referring to FIG. 2D, the flattening process may include selective oxidation, whereby the inner sidewall surface of the isolated third layer 117I may be selectively oxidized. The inner sidewall of the isolated third layer 117R may be converted into a vertical sidewall VS, and an additional oxide layer 122A may be formed on the vertical sidewall VS. The additional oxide layer 122A, which is a material corresponding to the sixth layer 122 of FIG. 1K, may serve as a blocking layer. When the additional oxide layer 122A is formed, the formation process of the sixth layer 122 may be omitted.

The vertical sidewall, the positive sloped sidewall and the negative sloped sidewall may be obtained, for example, by adjusting time of the flattening process.

Figure 3A:
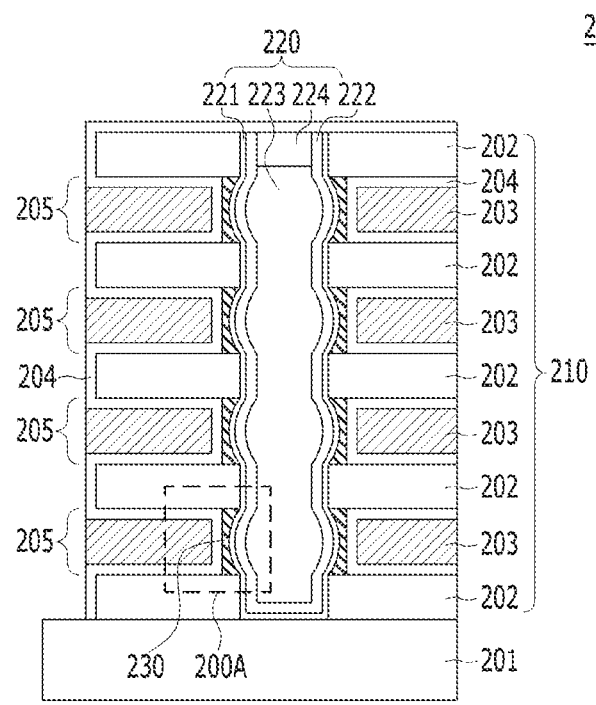
FIG. 3A is a diagram illustrating a semiconductor device in accordance with an embodiment.
Figure 3B:
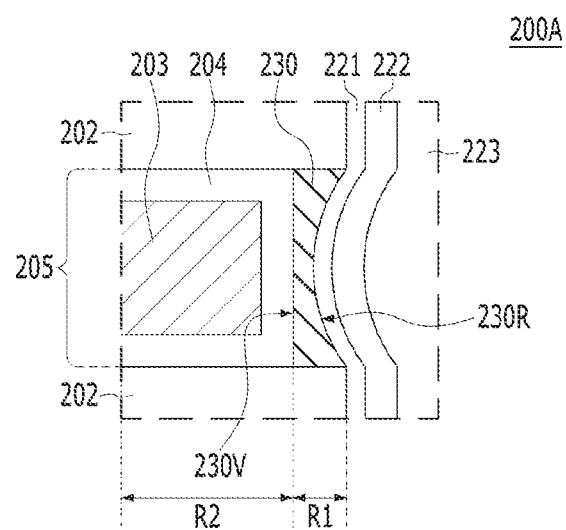
FIG. 3B is an enlarged view of a portion 200A illustrated in FIG. 3A.

FIG. 3A is a diagram illustrating a semiconductor device in accordance with an embodiment. FIG. 3A illustrates a vertical NAND 200. FIG. 3B is an enlarged view of a portion 200A illustrated in FIG. 3A.

Referring to FIG. 3A, the vertical NAND 200 may include a three-dimension (3D) NAND. The vertical NAND 200 may include a lower structure 201 and a cell stack 210. The cell stack 210 may be formed on the lower structure 201. In the cell stack 210, a dielectric layer 202 and a gate electrode 203 may be alternately stacked on each other. The vertical NAND 200 may further include a plurality of vertical channel structures 220 penetrating the cell stack 210.

A space between the neighboring dielectric layers 202 may be defined as a gate recess 205, and the gate recess 205 may be filled with a blocking layer 204 and the gate electrode 203.

Each of the vertical channel structures 220 may include a tunnel dielectric layer 221 adjacent to the gate electrode 203 and a channel layer 222 in contact with the tunnel dielectric layer 221. An inner space of the channel layer 222 may be filled with a core dielectric layer 223. A conductive pad 224 may be formed on the core dielectric layer 223. The vertical channel structure 220 may have a shape of penetrating the cell stack 210. The tunnel dielectric layer 221 may have a shape of surrounding the outer wall of the channel layer 222.

A charge trapping layer 230 may be formed between the gate electrode 203 and the tunnel dielectric layer 221. The charge trapping layer 230 may fill an inner portion of the gate recess 205. This is referred to as an isolated charge trapping layer.

Referring to FIG. 3B, the charge trapping layer 230 may fill a first portion R1 of the gate recess 205, and the gate electrode 203 and the blocking layer 204 may fill a second portion R2 of the gate recess 205.

The charge trapping layer 230 may include a vertical sidewall 230V and a rounded sidewall 230R facing the vertical sidewall 230V. The vertical sidewall 230V may directly contact the blocking layer 204, and the rounded sidewall 230R may directly contact the tunnel dielectric layer 221. The vertical sidewall 230V may provide a flat surface.

As described above, since the sidewall of the charge trapping layer 230 facing the gate electrode 203 has the vertical sidewall 230V, electrical characteristics of the vertical NAND 200 may be improved.

The vertical sidewall 230V of the charge trapping layer 230 may be modified to have various flat surfaces, as illustrated in FIGS. 2A to 2D. The charge trapping layer 230 may be located at each level of the gate electrode 203, and the charge trapping layers 230 may be discontinuous with one another according to a stacking direction of the cell stack 210.

FIGS. 4A to 4L are diagrams illustrating a method for fabricating a semiconductor device in accordance with an embodiment.

Figure 4A:
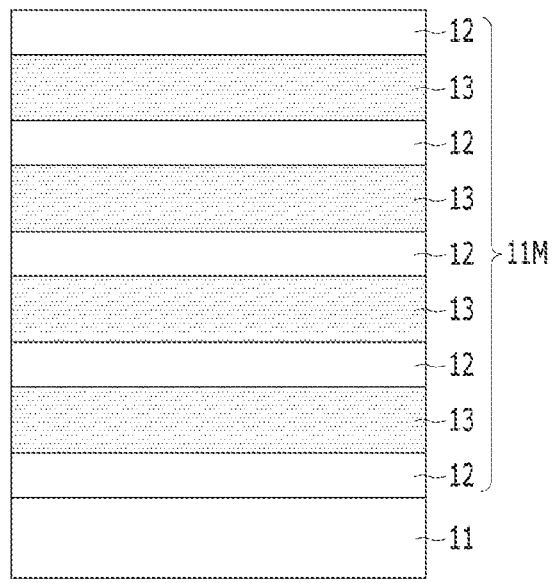
FIGS. 4A, 4B, 4C, 4D, 4E, 4F, 4G, 4H, 4I, 4J, 4K, and 4L are diagrams illustrating a method for fabricating a semiconductor device in accordance with an embodiment.

As illustrated in FIG. 4A, an alternating stack 11M may be formed on a substrate 11. The substrate 11 may be a material suitable for semiconductor processing. The substrate 11 may include a semiconductor substrate. For example, the substrate 11 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, combinations thereof or multi-layers thereof. The substrate 11 may include another semiconductor material, such as germanium. The substrate 11 may include an III/V-group semiconductor substrate, for example, a chemical compound semiconductor substrate such as gallium arsenide (GaAs). The substrate 11 may include a Silicon-On-Insulator (SOI) substrate.

The alternating stack 11M, which is a stacked body, may include a first material layer and a second material layer which are alternately stacked on each other. The first material layer may include a first material, and the second material layer may include a second material. The first and second materials may be different from each other. The first material layer and the second material layer may include a dielectric layer 12 and a sacrificial layer 13, respectively. The dielectric layer 12 may include a dielectric material, and the sacrificial layer 13 may include a sacrificial material. Herein, the sacrificial material may refer to a material to be removed in a subsequent process. The dielectric layer 12 may include at least one dielectric material of silicon oxide, silicon nitride, silicon oxynitride, a spin-on dielectric (SOD) material, dielectric metal oxide, silicate and dielectric metal oxynitride.

The sacrificial layer 13 may include a sacrificial material that can be selectively removed with respect to the dielectric layer 12. Herein, the sacrificial layer 13 may be selectively removed with respect to the dielectric layer 12. The ratio of the removal rate of the sacrificial layer 13 to the removal rate of the dielectric layer 12 may be referred to as a selectivity of the removal process of the sacrificial layer 13 with respect to the dielectric layer 12.

The sacrificial layer 13 may include a dielectric material. The sacrificial layer 13 may be replaced with a conductive material in a subsequent process. For example, the sacrificial layer 13 may be replaced with a gate electrode or a word line of a vertical NAND device. The sacrificial layer 13 may include silicon nitride, amorphous silicon or polysilicon. In some embodiments, the sacrificial layer 13 may include silicon nitride.

In an embodiment, the dielectric layer 12 may include silicon oxide, and the sacrificial layer 13 may include silicon nitride.

The alternating number of the dielectric layers 12 and the sacrificial layers 13 in the alternating stack 11M may be determined corresponding to the number of memory cells. For example, when 48 memory cells are vertically stacked, each of the dielectric layer 12 and the sacrificial layer 13 may be stacked 48 times. The dielectric layer 12 and the sacrificial layer 13 may be repeatedly stacked in a direction perpendicular to the surface of the substrate 11.

The dielectric layer 12 may be deposited by chemical vapor deposition (CVD) or atomic layer deposition (ALD). The sacrificial layer 13 may be deposited by the CVD or the ALD.

The lowermost and uppermost layers of the alternating stack 11M may be the dielectric layers 12. The dielectric layer 12 and the sacrificial layer 13 may have the same thickness. The uppermost dielectric layer 12 may have a larger thickness than the other dielectric layers 12. The uppermost dielectric layer 12 may be referred to as a dielectric cap layer.

Figure 4B:
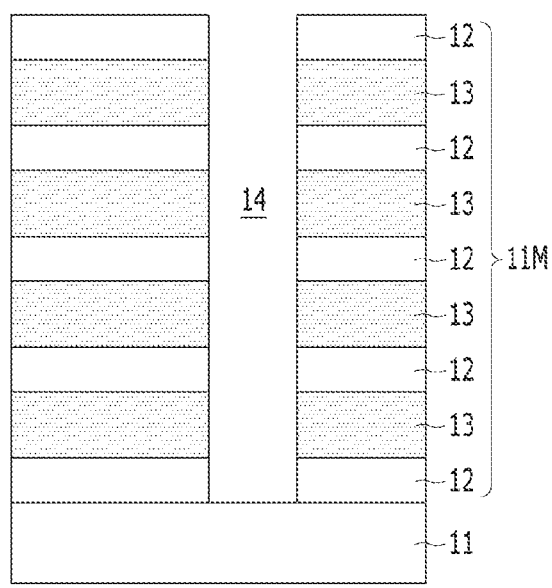

As illustrated in FIG. 4B, an opening 14 may be formed in the alternating stack 11M. A part of the alternating stack 11M may be etched using a mask (not illustrated) to form the opening 14. The mask may include a resist pattern, and the resist pattern may be formed by application of a resist material and a photolithography process. The resist material may include photoresist. The etch process for the alternating stack 11M to form the opening 14 may include an anisotropic etch process. For example, the anisotropic etch process may include a reactive ion etch (RIE) process. The RIE process for the dielectric layers 12 and the RIE process for the sacrificial layers 13 may be continuously performed.

The opening 14 may penetrate the alternating stack 11M, and be extended in a direction perpendicular from the surface of the substrate 11. The bottom surface of the opening 14 may expose the surface of the substrate 11. The opening 14 may include a vertical hole. More than one opening 14 may be arrayed. From a top view, the plurality of openings 14 may be arrayed in a zigzag. Each of the openings 14 may have a uniform size.

The sidewalls of the opening 14 may have vertical profiles. In some embodiments, the sidewalls of the opening 14 may have sloped profiles.

Figure 4C:
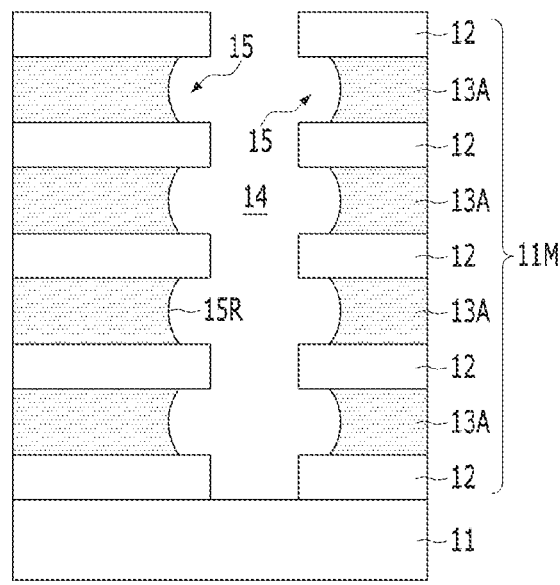
Figure 4D:
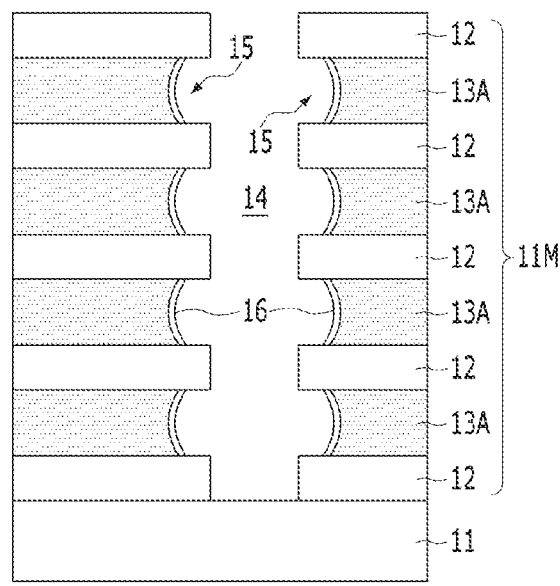

As illustrated in FIG. 4C, a selective etch process may be performed on the sacrificial layer 13. The selective etch process may be performed to laterally recess the sacrificial layer 13 with respect to the sidewall surface of the dielectric layer 12. A lateral recess 15 may be formed in the opening 14 by the selective etch process for the sacrificial layer 13. The selective etch process for the sacrificial layer 13 may include an anisotropic etch process or an isotropic etch process. For example, the selective etch process for the sacrificial layer 13 may include a wet etch process. When the sacrificial layer 13 includes silicon nitride and the dielectric layer 12 includes silicon oxide, the wet etch process may be performed using phosphoric acid.

After the selective etch process, the sacrificial layer 13 may remain as reference numeral "13A", and the edge of the sacrificial layer 13A may have a rounded profile. The inner sidewall surface of the lateral recess 15 may have a rounded profile 15R.

As such, both the edge of the sacrificial layer 13A and the inner sidewall of the lateral recess 15 have the rounded profiles. Specifically, the edge of the sacrificial layer 13A may have a negative rounded profile, and the inner sidewall of the lateral recess 15 may have a positive rounded profile. The negative edge profile of the sacrificial layer 13A may refer to a concave-shape sidewall.

As illustrated in FIG. 4, a sacrificial blocking layer 16 may be formed. The sacrificial blocking layer 16 may be formed on the sidewalls of the sacrificial layer 13A. In order to form the sacrificial blocking layer 16, a selective oxidation process may be performed. The selective oxidation process may selectively oxidize the sidewall surface of the sacrificial layer 13A. The selective oxidation process may include a thermal oxidation process, a radical oxidation process or a plasma oxidation process. When the sacrificial layer 13A includes silicon nitride, the sacrificial blocking layer 16 may be silicon oxynitride or silicon oxide. The sacrificial blocking layer 16 may have an extremely small thickness that does not fill the lateral recess 15. The sacrificial blocking layer 16 may cover the sidewall surface of the sacrificial layer 13A. Although not illustrated, the surfaces of the dielectric layers 12, which are exposed in the lateral recess 15, may be locally oxidized during the selective oxidation process. Also, although not illustrated, a part of the surface of the substrate 11, which is exposed at the bottom of the opening 14, may be locally oxidized during the selective oxidation process.

The sacrificial blocking layers 16 may be formed of a discrete material located at each level of the sacrificial layers 13A. The sacrificial blocking layers 16 may be vertically spaced apart from each other by the dielectric layers 12. As such, the sacrificial blocking layers 16 may be discontinuous with each other while covering the sidewall surfaces of the sacrificial layers 13A, and not cover the surfaces of the dielectric layers 12.

In some embodiments, deposition and etch-back processes may be performed on a continuous sacrificial blocking layer (not illustrated) to form the sacrificial blocking layers 16. In this case, a conformal deposition process may be performed to deposit the continuous sacrificial blocking layer. The continuous sacrificial blocking layer may include silicon oxide or silicon oxynitride. An additional etch-back process may be performed on the continuous sacrificial blocking layer so that the discontinuous sacrificial blocking layers 16 remain at each level of the sacrificial layers 13A.

The sacrificial blocking layers 16 may be formed along the edge profiles of the sacrificial layers 13A. Accordingly, the surfaces of the sacrificial blocking layers 16 may have rounded profiles, and the rounded surfaces of the sacrificial blocking layers 16 may contact the edges of the sacrificial layers 13A.

Figure 4E:
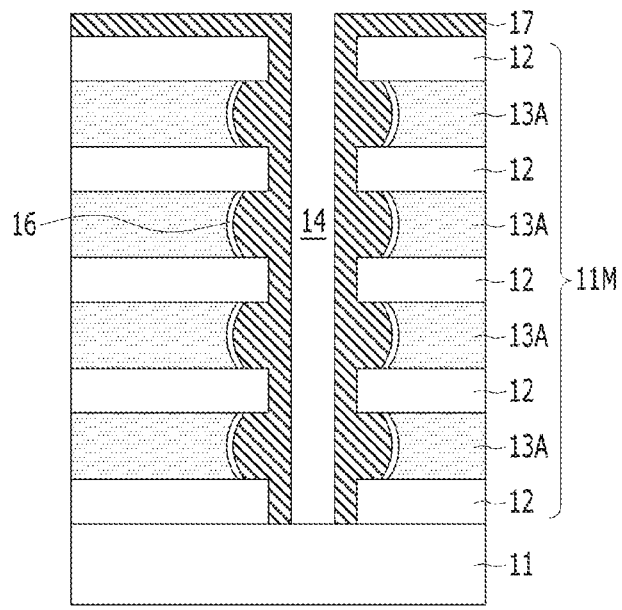

As illustrated in FIG. 4E, a charge trapping layer 17 may be formed in the lateral recess 15. The charge trapping layer 17 may cover the sidewalls of the dielectric layers 12. The charge trapping layer 17 may cover the sacrificial blocking layers 16. The charge trapping layer 17 may fill the lateral recess 15 without voids. The charge trapping layer 17 may include a charge trapping material. The charge trapping layer 17 may include a charge trapping dielectric material such as silicon nitride. The charge trapping layer 17 may be formed by a conformal deposition process, such as chemical vapor deposition (CVD) or atomic layer deposition (ALD). The charge trapping layer 17 may be a continuous charge trapping material. The charge trapping layer 17 may fully fill the lateral recess 15, and partially fill the central portion of the opening 14. In the lateral recess 15, the sidewall, that is, the inner sidewall, of the charge trapping layer 17 may contact the sidewall of the sacrificial blocking layer 16. The inner sidewall of the charge trapping layer 17 may be convex in a direction facing the sacrificial layer 13A. The inner sidewall of the charge trapping layer 17 may have a rounded profile, and the rounded sidewall of the charge trapping layer 17 may contact the sacrificial blocking layer 16.

Figure 4F:
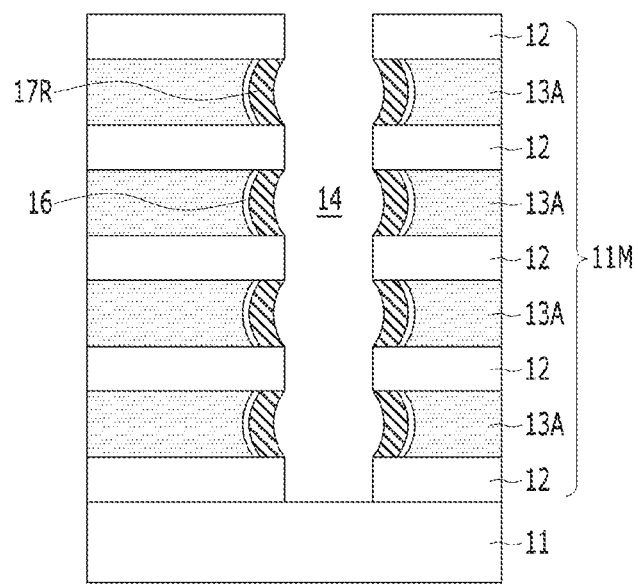

As illustrated in FIG. 4F, a trimming process may be performed on the charge trapping layer 17. The trimming process for the charge trapping layer 17 may include a selective etch process. The trimming process for the charge trapping layer 17 may include an anisotropic etch process or an isotropic etch process. For example, the trimming process for the charge trapping layer 17 may include a wet etch process. When the charge trapping layer 17 includes silicon nitride, the trimming process for the charge trapping layer 17 may be performed using phosphoric acid. In some embodiments, the trimming process for the charge trapping layer 17 may include an etch-back process.

Isolated charge trapping layers 17R may be formed by the trimming process for the charge trapping layer 17, and the isolated charge trapping layers 17R may be formed in the lateral recess 15. The isolated charge trapping layers 17R may be located at each level of the sacrificial layers 13A and sacrificial blocking layers 16. The isolated charge trapping layers 17R may directly contact the sacrificial blocking layers 16. The sidewalls of the isolated charge trapping layers 17R that contact the sacrificial blocking layers 16, that is, the inner sidewalls of the isolated charge trapping layers 17R may have rounded profiles. The sidewalls of the isolated charge trapping layers 17R that do not contact the sacrificial blocking layers 16, that is, the outer sidewalls of the isolated charge trapping layers 17R may have rounded profiles or vertical profiles.

Figure 4G:
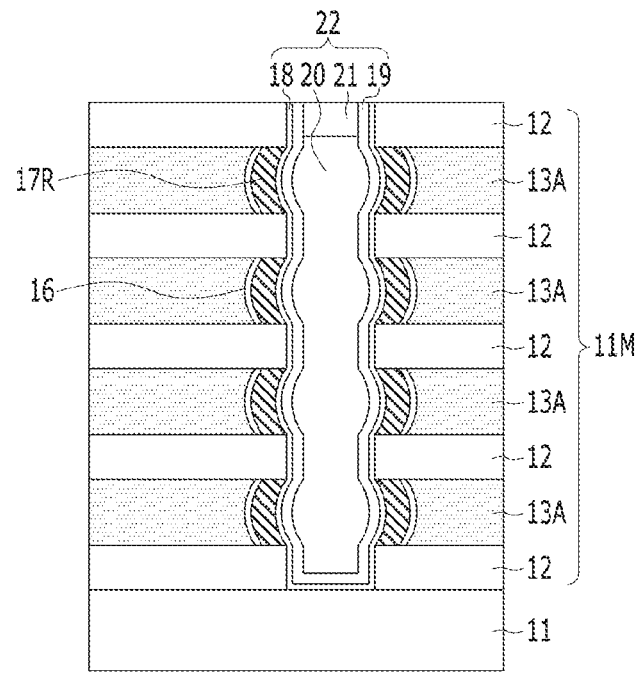

As illustrated in FIG. 4G, a tunnel dielectric layer 18 may be formed on the isolated charge trapping layers 17R. The tunnel dielectric layer 18 may be formed in the opening 14, and cover the sidewalls of the dielectric layers 12 while covering the isolated charge trapping layers 17R. The tunnel dielectric layer 18 may include silicon oxide.

A channel layer 19 may be formed on the tunnel dielectric layer 18. The channel layer 19 may include a semiconductor material. For example, the channel layer 19 may include any one of a polycrystalline semiconductor material, an amorphous semiconductor material and a monocrystalline semiconductor material. The channel layer 19 may include silicon (Si), germanium (Ge), silicon germanium (SiGe), an III/V-group compound or an II/VI-group compound. The channel layer 19 may include polysilicon. The channel layer 19 may be conformally formed on the tunnel dielectric layer 18 in the opening 14. The channel layer 19 might not fill the opening 14.

A core dielectric layer 20 may be formed on the channel layer 19. The core dielectric layer 20 may include silicon oxide or silicon nitride.

A conductive pad 21 may be formed on the core dielectric layer 20. The conductive pad 21 may include polysilicon doped with an impurity. The conductive pad 21 may be electrically coupled to the channel layer 19. The conductive pad 21 may be referred to as a drain electrode.

As described above, the tunnel dielectric layer 18, the channel layer 19, the core dielectric layer 20 and the conductive pad 21 may be abbreviated as a vertical pillar structure 22, and the vertical pillar structure 22 may fully fill the opening 14. The channel layer 19 may have a U-shaped cylinder structure, and the core dielectric layer 20 and the conductive pad 21 may fill the inside of the cylinder of the channel layer 19.

In some embodiments, the bottom portion of the tunnel dielectric layer 18 may be etched, and thus the bottom portion of the channel layer 19 may be coupled to the substrate 11.

Figure 4H:
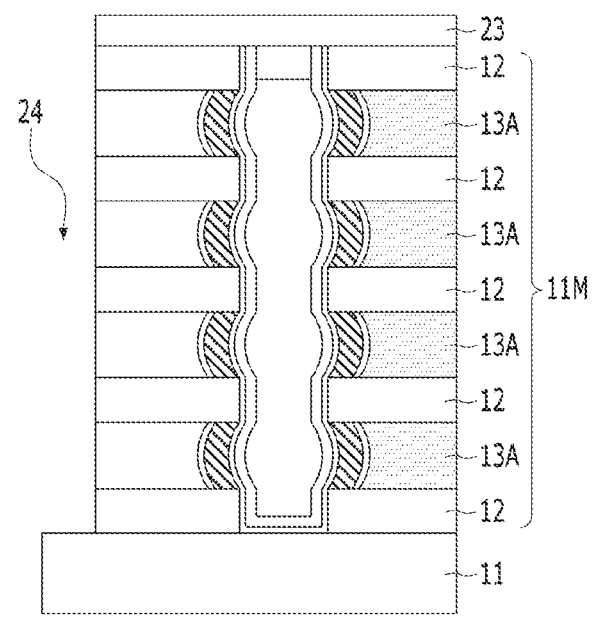

As illustrated in FIG. 4H, a slit 24 may be formed. In order to form the slit 24, another part of the alternating stack 11M may be etched using a patterned hard mask layer 23. The slit 24 may be extended perpendicularly from the surface of the substrate 11. From a top view, the slit 24 may have a line shape. The slit 24 may be referred to as a trench.

Figure 4I:
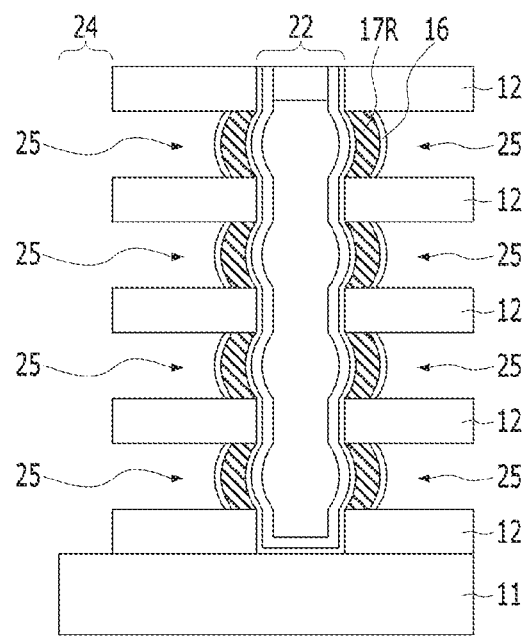

As illustrated in FIG. 4I, after the hard mask layer 23 is removed, the sacrificial layers 13A may be selectively removed. In some embodiments, the sacrificial layers 13A may be removed while the hard mask layer 23 remains.

In order to remove the sacrificial layers 13A, a dip-out process may be performed. After the sacrificial layers 13A are removed, some sidewalls of the sacrificial blocking layers 16 may be exposed.

As the sacrificial layers 13A are removed, gate recesses 25 may be formed horizontally between the dielectric layers 12. The gate recesses 25 may be vertically spaced apart from each other by the dielectric layers 12. The gate recesses 25 may expose the sidewalls of the sacrificial blocking layers 16. The gate recesses 25 may be extended in a direction parallel to the surface of the substrate 11. Each of the gate recesses 25 may have a high aspect ratio of height H to depth W equal to or greater than 1:5. Each of the gate recesses 25 may have a high aspect ratio parallel to the surface of the substrate 11.

The inner edge profiles of the gate recesses 25 may have rounded profiles. The rounded inner edge profiles of the gate recesses 25 may be provided by the rounded surfaces of the sacrificial blocking layers 16.

Figure 4J:
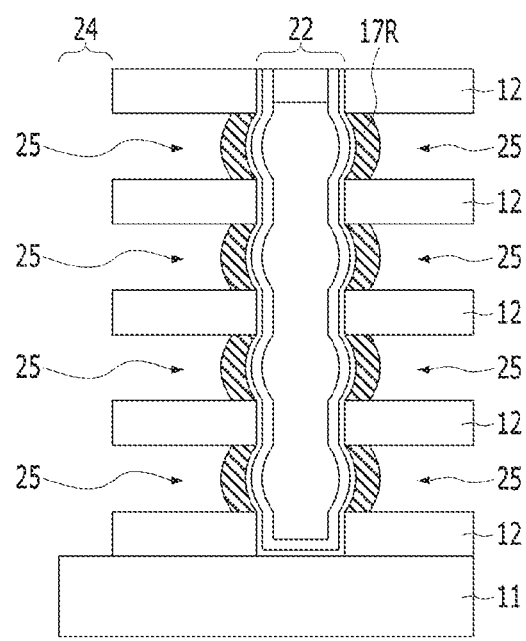

As illustrated in FIG. 4J, the sacrificial blocking layers 16 may be selectively removed. In order to remove the sacrificial blocking layers 16, a wet etch process may be performed. The depths of the gate recesses 25 may be extended by removing the sacrificial blocking layers 16. After the sacrificial blocking layers 16 are removed, some sidewalls of the isolated charge trapping layers 17R may be exposed in the gate recesses 25. The exposed sidewalls of the isolated charge trapping layers 17R may have rounded profiles. The inner edge profiles of the gate recesses 25 may have rounded profiles. The rounded inner edge profiles of the gate recesses 25 may be provided by the rounded sidewalls of the isolated charge trapping layers 17R. The rounded sidewalls of the isolated charge trapping layers 17R may have positive profiles. The positive rounded sidewalls of the isolated charge trapping layers 17R may refer to convex-shape sidewalls.

The rounded sidewalls of the isolated charge trapping layers 17R may provide non-flat surfaces.

Figure 4K:
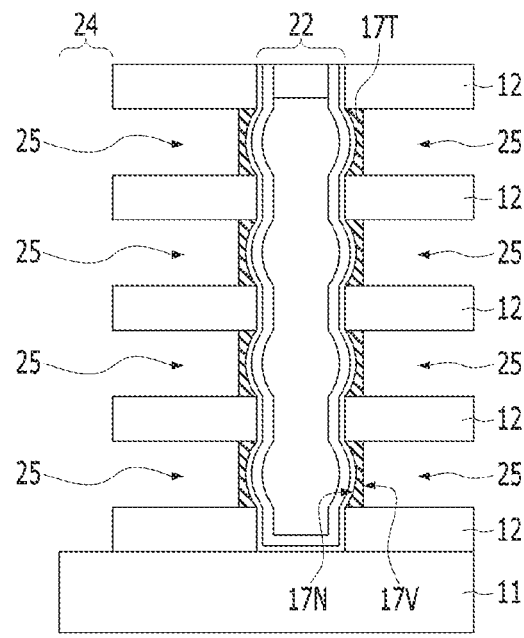

As illustrated in FIG. 4K, the rounded sidewalls of the isolated charge trapping layers 17R may be modified. For example, the rounded sidewalls of the isolated charge trapping layers 17R may be converted into non-rounded sidewalls. The non-rounded sidewalls may include flat sidewalls or vertical sidewalls. The process of converting the rounded sidewalls of the isolated charge trapping layers 17R into the flat sidewalls may be referred to as a flattening process.

After the flattening process, the isolated charge trapping layers may remain as reference numeral "17T". Each of the isolated charge trapping layers 17T may include a vertical sidewall 17V and a rounded sidewall 17N. The top surface and the bottom surface of the vertical sidewall 17V may directly contact the dielectric layers 12. The rounded sidewall 17N of the isolated charge trapping layer 17T may directly contact the tunnel dielectric layer 18.

In some embodiments, the flat sidewall of the isolated charge trapping layer 17T may be modified in various manners, as illustrated in FIGS. 2A to 2D.

The flattening process for the isolated charge trapping layer 17T may be performed by a dry cleaning process.

The flattening process for the isolated charge trapping layer 17T may include a selective oxidation process that selectively oxidizes the non-flat surface of the isolated charge trapping layer 17R, which is described above with reference to FIG. 2D.

Figure 4L:
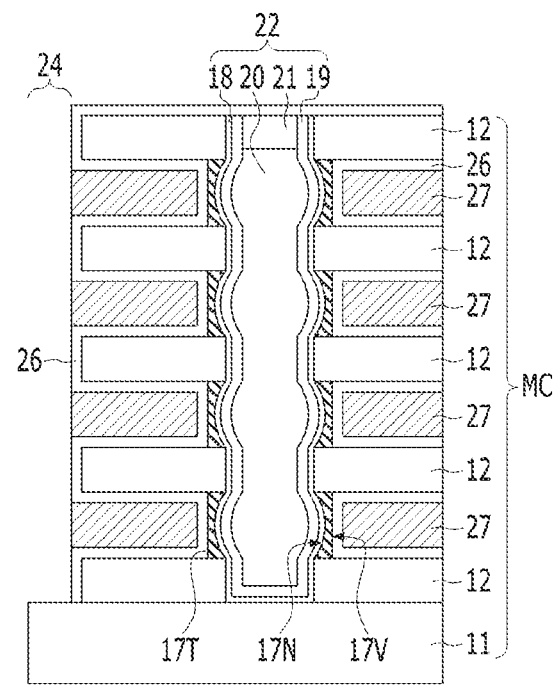

As illustrated in FIG. 4L, a blocking layer 26 may be formed on the vertical sidewall 17V of the isolated charge trapping layer 17T. The blocking layer 26 may cover the exposed surfaces of the dielectric layers 12 while covering the vertical sidewall 17V of the isolated charge trapping layer 17T. The blocking layer 26 may be a continuous layer that is conformally formed. The blocking layer 26 may be deposited by a conformal deposition process. The blocking layer 26 may include oxide, metal oxide, a high-k material or combinations thereof. The blocking layer 26 may include silicon oxide, aluminum oxide, hafnium oxide or combinations thereof.

Subsequently, gate electrodes 27 may be formed on the blocking layer 26. Each of the gate electrodes 27 may include polysilicon, a metal, metal nitride, metal silicide or combinations thereof. Each of the gate electrodes 27 may include titanium nitride, tungsten or a stack of titanium nitride and tungsten. The gate electrodes 27 may be formed in the respective gate recesses 25. In order to form the gate electrodes 27, a conductive material may be deposited to fill the gate recesses 25, and then an etch-back process may be performed on the conductive material. The gate electrodes 27 may be formed in the gate recesses 25. The neighboring gate electrodes 27 may be vertically spaced apart from each other by the dielectric layers 12.

In some embodiments, after the gate electrodes 27 are formed, the blocking layer 26 may be selectively etched. Accordingly, isolated blocking layers (not illustrated) may remain in the gate recesses 25. Each of the isolated blocking layers may have a shape of partially surrounding the gate electrode 27.

According to the above-described embodiments, the cell stack MC may be formed on the lower structure 11. In the cell stack MC, the dielectric layer 12 and the gate electrode 27 may be alternately and repeatedly stacked. The plurality of vertical channel structures 22 penetrating the cell stack MC may be formed. Each of the vertical channel structures 22 may include the tunnel dielectric layer 18 adjacent to the gate electrode 27 and the channel layer 19 in contact with the tunnel dielectric layer 18. The internal space of the channel layer 19 may be filled with the core dielectric layer 20. The conductive pad 21 may be formed on the core dielectric layer 20. The tunnel dielectric layer 18 may have a shape of surrounding the outer walls of the channel layer 19. The isolated charge trapping layer 17T may be formed between the gate electrode 27 and the tunnel dielectric layer 18. The isolated charge trapping layer 17T may fill an inner portion of the gate recess 25. The blocking layer 26 may be formed between the gate electrode 27 and the isolated charge trapping layer 17T.

According to the above-described embodiments, a shape of the charge trapping material may be modified into a flat shape, thereby improving electrical characteristics of the semiconductor device.

The embodiments are for describing, not limiting, the present disclosure. Further, it should be noted that the embodiments may be achieved in various ways through substitution, change, and modification, by those skilled in the art without departing from the scope of the present disclosure as defined by the following claims.

What is claimed is:

1. A method for fabricating a semiconductor device, comprising:
    forming a stacked body including a first layer, a second layer and a sacrificial layer provided between the first layer and the second layer;
    etching a first portion of the sacrificial layer to form a first gap between the first layer and the second layer;
    forming a sacrificial blocking layer by selectively oxidizing of exposed surface of the sacrificial layer in the first gap;
    forming a third layer having a non-flat surface in the first gap;
    removing the sacrificial blocking layer and a second portion of the sacrificial layer to form a second gap that exposes the non-flat surface of the third layer between the first layer and the second layer; and
    flattening the non-flat surface of the third layer.

2. The method of claim 1, wherein the non-flat surface of the third layer has a rounded profile.

3. The method of claim 1, wherein the non-flat surface of the third layer comprises a rounded convex sidewall.

4. The method of claim 1, wherein the flattening of the non-flat surface of the third layer comprises etching the non-flat surface of the third layer.

5. The method of claim 1, wherein, in the forming of the third layer, the third layer further comprises a rounded surface facing the non-flat surface.

6. The method of claim 1, wherein the forming of the first gap comprises:

forming a first through portion that penetrates the stacked body; and etching the first portion of the sacrificial layer through the first through portion, to form the first gap between the first layer and the second layer.

7. The method of claim 6, wherein the etching of the first portion of the sacrificial layer is performed by an isotropic etch process.

8. The method of claim 6, wherein the forming of the third layer having the non-flat surface in the first gap comprises:

forming the third layer that fills the first gap and covers a sidewall of the first through portion; and trimming the third layer to form an isolated third layer that is isolated to the first gap.

9. The method of claim 1, wherein the forming of the second gap comprises:

forming a second through portion by etching the stacked body in which the second portion of the sacrificial layer remains; and etching the second portion of the sacrificial layer through the second through portion, to form the second gap.

10. The method of claim 1, further comprising:

after the flattening of the non-flat surface of the third layer, forming a blocking layer on the third layer having a flattened surface; and forming a conductive material that fills the second gap, on the blocking layer.

11. The method of claim 1, wherein the third layer comprises a charge trapping material.

12. A method for fabricating a semiconductor device, comprising:

forming an alternating stack in which dielectric layers and sacrificial layers are alternately stacked on a substrate;

forming a first through portion in the alternating stack;

etching first portions of the sacrificial layers through the first through portion, to form lateral recesses between the dielectric layers;

forming sacrificial blocking layers by selectively oxidizing surfaces of the sacrificial layers in the lateral recesses;

forming charge trapping layers isolated in the lateral recesses;

forming a second through portion by etching the alternating stack in which second portions of the sacrificial layers remain;

removing the sacrificial blocking layers and the second portions of the sacrificial layers through the second through portion, to form gate recesses that expose non-flat surfaces of the charge trapping layers;

flattening the non-flat surfaces of the charge trapping layers; and forming a blocking layer and a gate electrode that fill the gate recesses.

13. The method of claim 12, wherein the non-flat surfaces of the charge trapping layers comprise rounded convex sidewalls.

14. The method of claim 12, wherein the flattening of the non-flat surfaces of the charge trapping layers comprises etching the non-flat surfaces of the charge trapping layers.

15. The method of claim 12, wherein the flattening of the non-flat surfaces of the charge trapping layers comprises converting the non-flat surfaces of the charge trapping layers into at least one of vertical sidewalls and sloped sidewalls.

16. The method of claim 12, wherein the forming of the charge trapping layers isolated in the lateral recesses comprises:

forming a charge trapping material layer that fills the lateral recesses and covers a sidewall of the first through portion; and trimming the charge trapping material layer to form the charge trapping layers physically isolated in each of the lateral recesses.

17. The method of claim 12, wherein each of the charge trapping layers comprises silicon nitride.

18. A method for fabricating a semiconductor device, comprising:

forming an alternating stack in which dielectric layers and sacrificial layers are alternately stacked on a substrate;

forming a first through portion in the alternating stack;

etching first portions of the sacrificial layers through the first through portion, to form lateral recesses between the dielectric layers;

forming charge trapping layers isolated in the lateral recesses;

forming a second through portion by etching the alternating stack in which second portions of the sacrificial layers remain;

removing the second portions of the sacrificial layers through the second through portion, to form gate recesses that expose non-flat surfaces of the charge trapping layers;

flattening the non-flat surfaces of the charge trapping layers; and forming a blocking layer and a gate electrode that fill the gate recesses, wherein the flattening of the non-flat surfaces of the charge trapping layers comprises selectively oxidizing the non-flat surfaces of the charge trapping layers.

* * * * *